(12) United States Patent
Obeng et al.

(10) Patent No.: US 6,323,131 B1
(45) Date of Patent: Nov. 27, 2001

(54) PASSIVATED COPPER SURFACES

(75) Inventors: Yaw Samuel Obeng; Jennifer S. Obeng, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/096,998

(22) Filed: Jun. 13, 1998

(51) Int. Cl.[7] .......................... H01L 21/44; B32B 15/08; B32B 27/40
(52) U.S. Cl. ..................... 438/687; 428/418; 428/425.8
(58) Field of Search ............................ 438/687; 428/418, 428/425.8, 450, 457

(56) References Cited

U.S. PATENT DOCUMENTS

| | | | |
|---|---|---|---|
| 5,508,141 | * | 4/1996 | Hart et al. ............................. 430/191 |
| 5,677,545 | * | 10/1997 | Shi et al. ................................ 257/40 |
| 5,721,056 | * | 2/1998 | Wessling ............................... 428/461 |
| 5,779,818 | * | 7/1998 | Wessling ............................... 148/240 |

FOREIGN PATENT DOCUMENTS

2679240 * 1/1993 (FR) ................................ C09D/5/08

OTHER PUBLICATIONS

M. M. Walczak et al., Modified Electrode Surfaces, The Electro–chemical Society, 4th Ed., 1997 39–40.

S.P. Murarka et al., Copper Metallization for ULSI and Beyond, Critical Reviews in Solid State & Materials Sciences, 20(2), 87–124 (1995).

J.M. Steigerwald, et al., Chemical Processes in the Chemical Mechanical Polishing of Copper, Materials Chemistry and Physics 41 (1995) 217–228.

S. Lakshminarayanan, et al., Contact and Via Structures with Copper Interconnects Fabricated Using Dual Damascene Technology, IEEE Electron Device Letters 15(8) 1994, 307–309.

S. Steinberg, et al., Ion Selective MOnolayer Membranes Based Upon Self–Assembling Tetradente Ligand Monolayers on Gold Electrodes. 3. Langmuir 8, 1992, 1183–1187.

S. Steinberg et al., Ion Selective Monolayer Membranes Based Upon Self–Assembling Tetradente Ligand Monolayers on Gold Electrodes. 2. J. Amer. Chem. Soc. 113, 1991, 5176–5182.

I. Rubenstein et al., Ionic Recognition and Selective Response in Self–Assembling Monolayer Membranes on Electrodes. Nature 332, 1988 426–429.

R.J.P. Williams, Self–Assembling Surfaces, Nature 332, 1988, 393.

* cited by examiner

*Primary Examiner*—Olik Chaudhuri
*Assistant Examiner*—Shrinivas H. Rao

(57) ABSTRACT

A ULSI circuit chip comprising copper interconnects is provided with a corrosion protection passivating layer on the surface of the copper which layer is comprised of a self assembled organic monolayer formed from treating the copper surface with a dilute solution of, for example a thio-bisalkyl acetoacetonate. A similar layer can be formed under the copper to provide a barrier layer against copper migration.

9 Claims, 1 Drawing Sheet

(a)

(b)

(c)

(d)

PASSIVATED COPPER SURFACES

FIELD OF THE INVENTION

This invention is directed to a method for passivating copper surfaces to prevent air corrosion of the surface and the passivated article produced thereby. More particularly, it is primarily directed to the passivation of the surfaces of copper interconnects and electrodes in ultra high scale integration integrated circuits (ULSI).

BACKGROUND OF THE INVENTION

A major limiting factor in ULSI interconnect technology is RC time delay introduced by the coupling of metal-insulator characteristics. An efficient interconnection scheme for advanced ULSI circuits requires materials with low effective time constants. In this regard, metals with low resistivity such as copper and the noble metals are emerging as materials of choice.

Some of the issues to be addressed in order for Cu-based interconnects to be a viable choice, especially as integration density continues to rise, involves the processes for patterning the copper lines, the prevention of diffusion of the copper into the underlying active substrate, and the prevention of air corrosion on the surface of the copper. The latter mentioned issues being the most important at this time.

Currently, new barrier materials deposited between the copper and the substrate or dielectric layer and processes related to their application to reliably prevent or substantially reduce copper contamination of the underlying material are under investigation. One reported barrier layer is a plasma assisted silicon nitride deposited film.

In order to passivate the copper surface subsequent to formation of the patterned copper interconnect lines, to both avoid interaction with adjacent dielectrics, e.g. $SiO_2$, and to avoid air oxidation, the current state of the art employs various techniques including the formation of a silicide coating over the exposed copper; encapsulation with thin deposited inorganic films such as a-Si or $Si_3N_4$; alloying of the copper surface to form $Cu_3Ti$, $Cu_3Pd$ or $CuAl_2$; and implantation of boron into the copper. These passivation steps usually involve harsh conditions such as elevated process temperatures (300° C.–400° C.), ion implantation and/or exposure to a plasma, which could adversely effect device fabrication. Also, these processes are relatively costly and time consuming. It would therefore be advantageous to find a less costly and/or less time consuming passivation process which preferably can be done in a single step without the need for specialized expensive capital equipment, and which does not employ harsh processing parameters. It is also desirable to find alternative barrier materials and processes to prevent migration of copper into the underlying substrate.

In the unrelated field of electrochemistry wherein gold electrodes are immersed in liquid electrochemical plating baths, spontaneously self-assembling mono-layer organic films have been employed to modify the surfaces of the gold electrodes. Such films have also been employed as biologically active membranes. These films have been described in various publications such as R. J. P. Williams, Self-Assembling Surfaces, *Nature* 332, 393, Mar. 31, 1988; I. Rubenstein et al., Ionic Recognition and Selective Response in Self Assembling Monolayer Membranes on Electrodes, *Nature* 332, 426–429, 1988; S. Steinberg et al., Ion-Selective Monolayer Based on Self Assembling Tetradentate Ligand Monolayers on Gold Electrodes. 2. Effect of Applied Potential on Ion Binding, *J. American Chemical Society* 113, 5176–5182, 1991; S. Steinberg et al., Ion-Selective Monolayer Based on Self Assembling Tetradentate Ligand Monolayers on Gold Electrodes. 3. *Langmuir* 8, 1183–1187, 1992; and M. M. Walczak et al., Modified Electrode Surfaces, *The Electrochemical Society*, 4th Edition, 39–40, 1997, all of which are incorporated herein by reference. We have now discovered that these same kinds of films can be employed to provide a passivation layer to prevent air corrosion of copper and more particularly to passivate copper interconnects in ULSI integrated circuits to substantially eliminate corrosion of the interconnects without any detrimental effects to the IC device. The same layers can also provide an effective barrier layer between the copper and its underlying substrate.

SUMMARY OF THE INVENTION

A process for passivating the surface of copper to prevent air corrosion thereof which process is particularly useful in the manufacture of high density integrated circuits utilizing copper interconnects comprises forming, preferably in a single step, a self-assembled mono- or multi-layer organic passivating film or membrane over an exposed copper surface by treating the copper surface with a dilute solution of the film forming molecules for a time sufficient for the spontaneous adsorption of these molecules in the form of a densely packed self-assembled layer on the copper surface. The same kind of self assembled layer may be formed on the material underlying the copper interconnects to provide a barrier layer which prevents migration of copper into the underlying substrate.

The invention further includes the article of manufacture having such a passivating, corrosion protection, or barrier layer film thereon.

It should be understood that while the invention is described in terms of the manufacture of ULSI circuits having copper interconnects, it is useful to protect any copper surface from air corrosion, e.g. copper roofing and copper pipes and the like.

DETAILED DESCRIPTION

Figure 1:
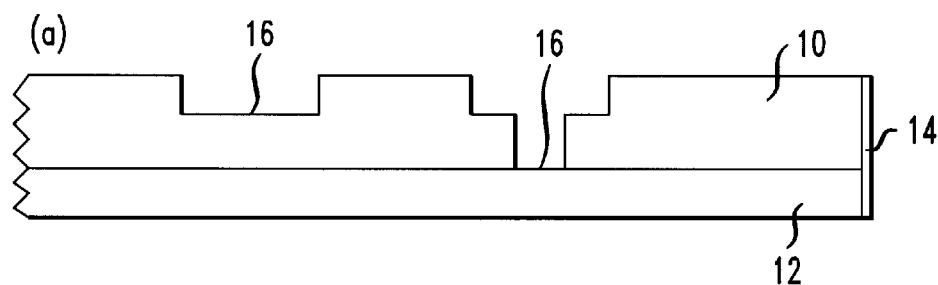
FIGS. 1(*a*)–1(*d*) is a cross sectional view of an IC chip depicting the steps in forming a patterned copper film, e.g. copper interconnects, on an underlying integrated circuit substrate and passivating such film, including multi-layer substrates wherein each layer is provided with a patterned copper film.
Figure 1:
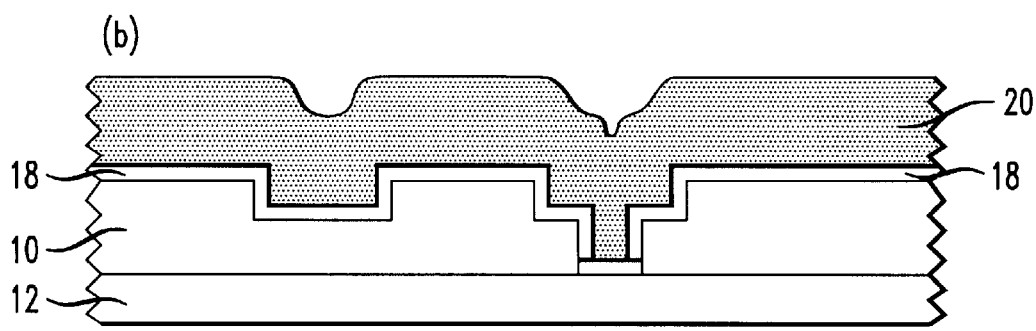
Figure 1:
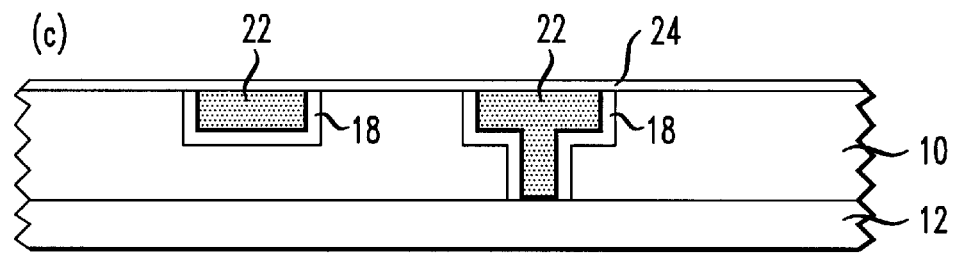
Figure 1:
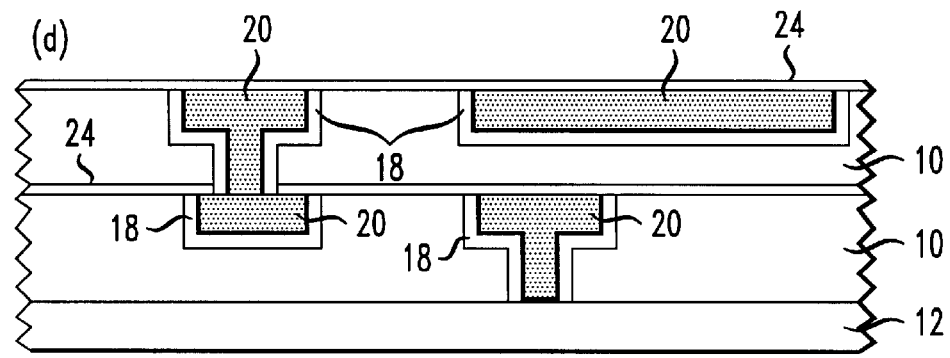

We have found that spontaneously adsorbed self-assembled mono-layer or multi-layer organic films can be generated on metallic copper surfaces so as to provide a passivating film thereon which protects the surface from atmospheric corrosion. In addition, such films can provide a temporary barrier layer between the substrate and the copper interconnects. When used as a barrier layer, receptor sites in the membrane capture and bind divalent ions such as copper, zinc and cadmium ions and prevent their migration into the substrate. Generally, these barrier membranes may be destroyed during subsequent plasma/wet etch processing.

Typically, the passivating organic films are comprised of long alkyl chain silanes, carboxylic acids, and thiols. Preferred films are formed from molecules having the formula $X[CH_2(CH_2)_n-O-C(O)CH_2C(O)CH_3]_2$ where X is S, Si or N, n is from 2 to 6 and derivatives thereof, although longer chains are also suitable, e.g. chain lengths of n=18.

Further, while primary alkyl chains are preferred, branched chains can be employed. The chemical compositions of the films can be altered by introducing a variety of terminal groups, such as —OH, —$CO_2$H, —CN, —$CO_2CH_3$, and —$CH_3$ onto the useful molecules. Particularly useful compounds are the 2,2'-thiobisalkyl acetoacetonates such as 2,2'-thiobisethyl acetoacetonate (TBEA) and analogues such as 2,2'-silobisethyl acetoacetonate. These films form a densely packed two dimensional layer (usually a monolayer) on the copper or underlying surface.

The integrity of these self-assembled monolayers can be enhanced by the addition of a surface sealing component to the film forming solution, or alternatively such surface sealing component can be formed subsequent to the formation of the primary self-assembled film. Suitable surface sealing components include surfactant thiols such as $C_nH_{2n+1}$SH where n is from 6 to 18, primary or secondary alkyl amines wherein the alkyl group contains from 4 to 20 carbon atoms, and aliphatic silanes such as an n-alkyl trichlorosilane having from 6–20 carbon atoms. Preferred sealants include n-octadecylmercaptan (OM) and n-octadecyl trichlorosilane (OTS).

The films spontaneously form on the copper surface when the surface, which is preferably clean prior to exposure to the film forming solution, is immersed or otherwise treated (such as by vapor flow coating wherein a vapor of the solution is formed by bubbling an inert gas through the solution which is swept into a chamber containing the substrate to be coated, spray coating or spin coating) with a dilute solution of the film forming compounds. Generally the film forming compounds are dissolved in a solvent or solvent mixture at concentrations in the range of $1100 \times 10^{-3}$ M. Examples of appropriate solvents for the preferred film forming compounds are bicyclohexyl and chloroform and mixtures thereof such as a 4:1 mixture of bicyclohexyl:chloroform. This mixture is also useful when the film comprises 3,3'-thiobispropyl acetoacetate (TBPA). With the trichlorosilanes, one can use bicyclohexyl or Isopar G™. It should be noted that the method is not limited to any particular solvent or solvent combination and one can employ other solvents which will dissolve the active film forming compounds. For commercial applications, it is best to employ solvents which are relatively volatile, fairly soluble in water without hydrolizing and easily dried. Further, it is preferable to employ solvents which can comply with EPA and OSHA standards. To these ends, it is preferred to first dissolve the organic molecules in the minimum amount of the above mentioned solvents and then dilute the solution to its final desired molarity with a low molecular weight alcohol such as methanol, ethanol or isopropanol.

The copper must be exposed to the film forming solution for a time sufficient to allow for the spontaneous formation of the self-assembled film. Typically such time may be from 0.5 minutes to several hours, but preferably between several minutes to 0.5 hours at temperatures from room temperature to well below the flash point of the solvent. After formation of the film, the substrate may be washed and dried to remove excess solution.

The formation of copper interconnect layers on ULSI circuits and the passivation of the copper surfaces to prevent corrosion in the clean room and under chemical mechanical polishing (CMP) and post CMP cleaning conditions are depicted with reference to FIG. 1. The Damascene process to generate an inlaid copper interconnection pattern and the CMP process are well known in the art and can be employed herein. These processes, as well as other well known prior art processes for depositing and patterning copper films for IC devices are referenced in and described by S. P. Murarka et al., Copper Metallization for ULSI and Beyond, *Critical Reviews in Solid State and Materials Sciences*, 20(2), 87–124 (1995) and J. M. Steigerwald et al., Chemical Processes in the Chemical Mechanical Polishing of Copper, *Materials Chemistry and Physics*, 41, 217–228, (1995), which articles are incorporated herein by reference.

Illustratively, use of the self assembled organic films can be integrated into existing processing steps as hereinafter described. For example, a dielectric layer 10, e.g. $SiO_2$, is deposited on a silicon substrate 12 by known techniques. One can optionally now seal the silicon edge and backside with a self assembled organic film 14 as described herein or with a chemical oxide. The desired trenches and vias 16 (FIG. 1(a)) are then etched in the $SiO_2$ or other dielectric by conventional reactive-ion etching to form the damascene structure, preferably without damaging any self assembled organic sealant film 14. Any such film 14 which is on top of the dielectric 10 will act as a photoresist adhesion promoter. A thin diffusion barrier/adhesion promoter film 18 may the be deposited, which again may be a self assembling organic film, followed by the deposition of a copper seed layer which is then capped with a thick copper film 20 by known techniques to give rise to the structure shown in FIG. 1(b). The copper layer 20 is then treated in accordance with standard CMP processing, stopping at the oxide layer followed by a post CMP cleaning with $CO_2$-sparged deionized water, pH ~4, in a megasonics agitated system or with brush scrubbing and ending with a structure as shown in FIG. 1(c). The remaining exposed copper layer 22 is then passivated with a spontaneous self assembling film 24 as described above. The above steps may then be repeated as required to form a device having multilevel interconnections as shown in FIG. 1(d).

It should be understood that the embodiments described above are not intended to limit the invention. On the contrary, the invention is intended to cover alternatives, modifications and equivalents within the spirit and scope of the invention as defined in the appended claims.

What we claim is:

1. An article of manufacture comprising a protective film located over the metallic copper layer and that includes a self assembled organic compound, said protective film comprising a compound having the formula $X[(CH_2(CH_2)_n—O—C(O)CH_2C(O)CH_3]_2$ where X is S, Si, or N and n is from 2 to 6.

2. The article set forth in claim 1 wherein said film further comprises a surface sealing component.

3. The article set forth in claim 2 wherein said surface sealing component is selected from the group consisting of:

surfactant thiols represented by the formula $C_nH_{2n+1}$SH where n is from 6 to 18;

alkyl amines wherein the alkyl group contains from 4 to 20 carbon atoms; and aliphatic silanes selected from the an n-alkyl trichlorosilane wherein the alkyl group contains from 6 to 20 carbon atoms.

4. The article set forth in claim 1 wherein said film is a mono-layer.

5. A high density integrated circuit having copper interconnects comprising a protective film located over the metallic copper layer and that includes a self assembled organic passivating film on the surface of said copper interconnects, said protective film comprising a compound having the formula $X[(CH_2(CH_2)_n—O—C(O)CH_2C(O)CH_3]_2$ where X is S, Si, or N and n is from 2 to 6.

6. The integrated circuit set forth in claim 5 wherein said film further comprises a surface sealing component.

7. The integrated circuit set forth in claim 6 wherein said surface sealing component is selected from the group consisting of:

surfactant thiols represented by the formula $C_nH_{2n+1}SH$ where n is from 6 to 18;

alkyl amines wherein the alkyl group contains from 4 to 20 carbon atoms; and aliphatic silanes selected from the an n-alkyl trichlorosilane wherein the alkyl group contains from 6 to 20 carbon atoms.

8. The integrated circuit set forth in claim 5 further comprising a barrier layer underlying said copper interconnects, said barrier layer consisting essentially of a self-assembled organic film.

9. The article set forth in claim 1 wherein said self assembled organic compound is selected from the group consisting of:

a long alkyl chain silane;

a carboxylic acid; and a thiol.

\* \* \* \* \*